United States Patent
Magalhães Mendes et al.

(10) Patent No.: US 10,629,386 B2
(45) Date of Patent: Apr. 21, 2020

(54) SUBSTRATE AND ELECTRODE FOR SOLAR CELLS AND THE CORRESPONDING MANUFACTURING PROCESS

(75) Inventors: Adélio Miguel Magalhães Mendes, Oporto (PT); Luísa Manuela Madureira Andrade, Oporto (PT); Joaquim Gabriel Magalhães Mendes, Oporto (PT); José Miguel Lopes Maçaira Nogueira, Espinho (PT); Fernando Manuel Da Silva Ribeiro, Magueija (PT)

(73) Assignee: EFACEC ENGENHARIA E SISTEMAS, S.A., Maia (PT)

(*) Notice: Subject to any disclaimer, the term of this patent is extended or adjusted under 35 U.S.C. 154(b) by 658 days.

(21) Appl. No.: 14/006,928

(22) PCT Filed: Mar. 22, 2012

(86) PCT No.: PCT/IB2012/051376
§ 371 (c)(1),
(2), (4) Date: Dec. 9, 2013

(87) PCT Pub. No.: WO2012/127443
PCT Pub. Date: Sep. 27, 2012

(65) Prior Publication Data
US 2014/0090685 A1  Apr. 3, 2014

(30) Foreign Application Priority Data

Mar. 22, 2011 (PT) .......................... 105578
Mar. 22, 2011 (PT) .......................... 105579

(51) Int. Cl.
*H01G 9/00* (2006.01)
*H01G 9/20* (2006.01)
*H01L 51/44* (2006.01)

(52) U.S. Cl.
CPC ......... *H01G 9/2077* (2013.01); *H01G 9/0029* (2013.01); *H01G 9/2022* (2013.01);
(Continued)

(58) Field of Classification Search
CPC ...................................................... H01L 51/445
See application file for complete search history.

(56) References Cited

U.S. PATENT DOCUMENTS 6,462,266 B1 * 10/2002 Kurth ................... H01G 9/2031
136/251
2003/0230337 A1  12/2003 Gaudiana et al.
(Continued)

FOREIGN PATENT DOCUMENTS

DE    43 03 055 A1   8/1993
EP    1 174 891 A2   1/2002
(Continued)

OTHER PUBLICATIONS

Lee et al. (2006). Glass frit overcoated silver grid lines for nanocrystalline dye sensitized solar cells. *Journal of Photochemistry and Photobiology*, 183(1-2), 133-137.
(Continued)

*Primary Examiner* — Sadie White
(74) *Attorney, Agent, or Firm* — John P. White; Cooper & Dunham LLP

(57) ABSTRACT

Solar cells use as substrates glass (23) coated with a transparent conductive layer (21), able to collect the electric power generated by the solar cell. This layer (21), normally a TCO, have limited conductivity, implying the use of current collector lines applied in a complex manner. The conductivity of the conductive layer (21) is increased by the application of a structure, in particular a grid, of thin conductive lines (22) inserted in grooves on the glass surface (23) or directly applied on this, followed by a TCO layer (Continued)

Figure 1:
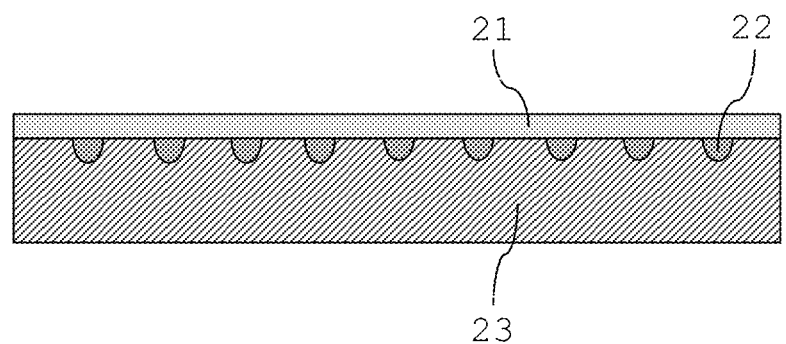

coating (21). This highly conductive grid (22) collects the electricity from the TCO layer (21) and directs it to the periphery of the cell.

Both glass substrates are sealed by a process employing a precursor of glass surrounding the entire perimeter of the substrate. The glass precursor is heated to its melting point, by a laser, completely sealing the two substrates of the module.

16 Claims, 4 Drawing Sheets

(52) U.S. Cl.
CPC ......... *H01G 9/2027* (2013.01); *H01G 9/2031* (2013.01); *H01G 9/2059* (2013.01); *H01G 9/2068* (2013.01); *H01L 51/445* (2013.01); *Y02E 10/542* (2013.01); *Y02E 10/549* (2013.01); *Y02P 70/521* (2015.11)

(56) References Cited

U.S. PATENT DOCUMENTS

| | | | | |
|---|---|---|---|---|
| 2004/0163700 A1* | 8/2004 | Mizuta | ................ | H01G 9/2013 136/263 |
| 2004/0248394 A1* | 12/2004 | Kobayashi | ............. | C23C 14/08 438/609 |
| 2005/0072458 A1 | 4/2005 | Goldstein | | |
| 2007/0095389 A1 | 5/2007 | Cho et al. | | |
| 2007/0163645 A1* | 7/2007 | Gonda | ................ | H01G 9/2031 136/263 |
| 2007/0251570 A1* | 11/2007 | Eckert | ................ | H01G 9/2031 136/256 |
| 2008/0202585 A1* | 8/2008 | Yamanaka | ........... | H01G 9/2031 136/263 |
| 2009/0242017 A1* | 10/2009 | Yasuda | ............. | B32B 17/10036 136/252 |
| 2011/0008926 A1* | 1/2011 | Irvin | ................... | H01L 51/0096 438/82 |
| 2011/0306161 A1* | 12/2011 | Magalhaes Mendes | ..................... | H01G 9/2077 438/66 |
| 2012/0080671 A1* | 4/2012 | Niboshi | ................ | H01L 51/524 257/40 |
| 2012/0207952 A1* | 8/2012 | Walp | .................. | B23K 26/0063 428/34 |

FOREIGN PATENT DOCUMENTS

| | | | | |
|---|---|---|---|---|
| JP | 2005 302508 A | 10/2005 | | |
| WO | WO 2009/084851 A2 | 7/2009 | | |
| WO | WO-2010064213 A1 * | 6/2010 | ........... | H01G 9/2077 |
| WO | WO-2010143337 A1 * | 12/2010 | ........... | H01L 51/524 |

OTHER PUBLICATIONS

International Search Report, dated Mar. 5, 2013 in connection with PCT International Application No. PCT/IB2012/051376, filed Mar. 22, 2012.

Written Opinion of the International Searching Authority, dated Mar. 5, 2013 in connection with PCT International Application No. PCT/IB2012/051376, filed Mar. 22, 2012.

* cited by examiner

SUBSTRATE AND ELECTRODE FOR SOLAR CELLS AND THE CORRESPONDING MANUFACTURING PROCESS

CROSS-REFERENCE TO RELATED APPLICATIONS

This application is a § 371 national stage of PCT International Application No. PCT/IB2012/051376, filed Mar. 22, 2012, claiming priority of Portuguese Patent Applications Nos. 105578, filed Mar. 22, 2011 and 105579, filed Mar. 22, 2011, the contents of each of which are hereby incorporated by reference in its entirety.

TECHNICAL DOMAIN

The present invention describes a new manufacturing process of dye-sensitized solar cells modules, by means of a laser sealing process of the substrates and by improving the conductivity of the glass substrates coated with a transparent conductive oxide, through the incorporation of conductive lines to allow greater electronic conductivity.

SUMMARY

The present invention describes a new process for the manufacture of dye-sensitized solar cell modules, which show an improvement in long-term stability. An innovative process for sealing substrates is described. A laser beam is used to support the glass melting and subsequent sealing of the module. In addition, the substrates coated with a transparent conductive oxide (TCO) are improved to allow a greater electronic conductivity.

The present invention discloses a process for the manufacture of solar cells comprising the following steps: preparing a glass substrate to the photo-electrode (10) and a glass substrate to the counter electrode (11), applying to the mentioned substrates a TCO layer (8); depositing the material of both photo-electrode (10) and counter electrode (11); if necessary, sinter the mentioned electrodes (10, 11); depositing the glass welding material (4) on the substrates able to stick them together and to isolate the solar cell; if necessary, evaporating the solvents material deposited; close and align the glass substrate of the photo-electrode (10) with the glass substrate of the counter electrode (11); laser welding the two substrates by means the previously deposited sealing material(4).

A preferred embodiment of the present invention has the characteristic that the laser welding is carried out in a forward-backward pathway, able to disperse heat over a given length of the welding line in order to obtain a progressive heating and cooling, resulting in a stable welding line.

A preferred embodiment of the present invention has the additional characteristic of comprising the step of embedding or depositing on one or both of the mentioned substrates a conductive mesh able to carry current for the cell exterior. This occurs before the sealing step.

A preferred embodiment of the present invention has the characteristic of depositing at appropriate time on the photo-electrode (10) the active material, in particular the active dye.

A preferred embodiment of the present invention has the additional characteristic of comprising the step of solvent recirculation to remove active material from the photo-electrode that has not been adsorbed.

A preferred embodiment of the present invention has the characteristic of further comprise the steps of:
drilling one of the substrates so that the electrolyte (1) can be subsequently introduced in the cell;
then introduce the electrolyte (1) in the cell through one or more holes previously made;
seal the holes previously made.

A preferred embodiment of the present invention has the characteristic of sealing one or more holes previously made by means a laser and a welding material for glass.

A preferred embodiment of the present invention has the characteristic of depositing, i.e. performing the dye adsorption in the photo-electrode (10) by injecting the mentioned active material per one of the holes and collection of it on the other hole.

A preferred embodiment of the present invention has the characteristic of further comprise the step of submitting and maintaining a suitable pressure to bond the substrates together.

A preferred embodiment of the present invention has the characteristic of further comprise the step of heating the glass elements prior to laser welding.

A preferred embodiment of the present invention has the characteristic that the heating step is done between 100° C. and 300° C.

In a preferred embodiment, the characteristics of the glass paste are such that the melting point is below 500° C. and more preferably below 400° C. It should also absorb light of the laser beam, relatively to the glass substrates used, and more preferably should absorb more than 80% of incident radiation.

A preferred embodiment of the present invention has the characteristic of further comprise the step of maintaining the mentioned substrate spaced at a predetermined distance (12) and constant throughout all active area of the cell during the welding process.

A preferred embodiment of the present invention has the characteristic that the mentioned spacing is obtained using a metal spacer placed between the substrates.

A preferred embodiment of the present invention has the characteristic of the glass sealing material (4) is a glass paste or a glass powder with a melting point low enough so that the sealing step does not cause deterioration of the inner components of the cell by overheating.

A preferred embodiment of the present invention has the characteristic of the active material of the photo-electrode (10) is a dye adsorbed into the pores of the semiconductor, selected from: dyes based on ruthenium bipyridyl complexes, organic dyes such as porphyrins, phthalocyanines, cyanines and merocyanines, hemicyanines, anthocyaninES, indoline, coumarin, Eosin Y, perylene, anthraquinone, pentacene, trifenilamine, quantum dots, or combinations thereof.

A preferred embodiment of the present invention has the characteristic of the material of the conductive mesh be a metal selected from Ag, Au, Cu, Al, Ni, Sn, or composite materials based on these metals, or mixtures of two or more thereof.

A preferred embodiment of the present invention has the characteristic of the laser having a maximum output at wavelengths between 1000 nm and 1200 nm and a maximum power between 5 W and 60 W.

The present invention further describes a manufacturing process module of a plurality of solar cells manufactured according to the above-described and additionally characterized by comprising the steps of:

provide adjacent solar cells with the same disposition of the mentioned photo-electrode (10) and counter-electrode (11) substrates;
deposit glass sealing material (3) on the substrates, allowing them to stick together and isolate the solar cell module;
laser welding of the two substrates via the previously deposited sealing material for glass (3).

A preferred embodiment of the present invention has the feature of further comprise the steps of:
provide adjacent solar cells to a reverse arrangement of the mentioned photo-electrode (10) and counter-electrode (11) substrates;
deposit glass sealing material (3) on the substrates, allowing them to stick together and isolate the solar cell module;
deposit conductive material (13) in the substrate, suitable for electrically connect the photo-electrode (10) to the counter-electrode (11) of adjacent cells;
deposit sealing material for glass (4) in the substrates, capable to isolate the mentioned conductive material (13) of the remaining elements of the cells; laser welding of the two substrates via the previously deposited sealing material for glass (3, 4).

A preferred embodiment of the present invention has the characteristic of further comprise the step of cutting by laser, if present, the TCO layer deposited on one or both substrates and, if present, the mesh embedded or deposited on one or both substrates, to electrically separate adjacent solar cells.

The present invention further discloses a device obtainable by the manufacturing process according to any of those described above.

It is object of the present invention to provide solutions to the relatively low conductivity of the transparent oxide layers applied to glass substrate in solar cells.

The present invention has as advantage the enhancement of the mentioned conductivity.

The present invention discloses an electrode substrate and solar cell comprising:
a layer of insulating substrate (23);
a layer of a conductive electrode of transparent oxide or oxides (21) applied on the mentioned insulating substrate (23);
and additionally a conductive mesh (22) between the mentioned layer of insulating substrate (23) and the mentioned conductive electrode layer of transparent oxide or oxides (21).

A preferred embodiment of the present invention has the characteristic of the mentioned layer of insulating substrate (23) comprises grooves and the mentioned conductive mesh (22) lies in those grooves.

A preferred embodiment of the present invention has the characteristic of the mentioned rows and grooves have identical cross sections.

A preferred embodiment of the present invention has the characteristic that the mentioned grooves have depth and width of less than 500 µm.

A preferred embodiment of the present invention has the characteristic that the mentioned grooves have depth and width of less than 200 µm.

A preferred embodiment of the present invention has the characteristic that the mentioned grooves have depth and width higher than 50 µm.

A preferred embodiment of the present invention has the characteristic of the mentioned conductive mesh (22) is disposed on the surface of the mentioned layer of insulating substrate (23).

A preferred embodiment of the present invention has the characteristic of the mentioned lines have a width between 100 µm and 1000 µm.

A preferred embodiment of the present invention has the characteristic of the mentioned lines have a thickness less than 10 µm.

A preferred embodiment of the present invention has the characteristic of the mentioned lines have a thickness less than 1 µm.

A preferred embodiment of the present invention has the characteristic of the mentioned lines have a thickness higher than 200 nm.

A preferred embodiment of the present invention has the characteristic of the mentioned conductive mesh (22) is a grid or a hexagonal mesh, or a fractal structure, or an interdigital structure.

A preferred embodiment of the present invention has the characteristic of the rows and columns of the mentioned grid (22) is separated each other between 1 mm and 20 mm.

A preferred embodiment of the present invention has the characteristic of the mentioned conductive mesh (22) comprises a metal, or a metal alloy, whose melting temperature must be above the maximum temperature of sintering of the conductive electrode (21) and below the temperature permitted by the insulating substrate (23).

A preferred embodiment of the present invention has the characteristic of the mentioned conductive mesh (22) comprises zinc, or aluminum, or silver, or silicon, or copper, or combinations thereof.

A preferred embodiment of the present invention has the characteristic of the mentioned conductive mesh (22) comprises an alloy of zinc, aluminum and silicon with a melting temperature of approximately 535° C.

A preferred embodiment of the present invention has the characteristic of the mentioned insulating substrate (23) comprises a glass or a flexible plastic film.

A preferred embodiment of the present invention has the characteristic of the mentioned conductive electrode (21) comprises ITO or AZO or GZO or FTO, or combinations thereof.

The present invention further discloses a solar cell comprising a substrate and an electrode according to the above described.

The present invention further describes a solar collector system comprising solar cells according to the above described.

The present invention further describes a method of manufacturing a substrate and an electrode for solar cells, which comprises depositing a layer of a conductive electrode made of transparent oxide or oxides (21) on an insulating substrate (23);
which further comprises depositing a layer of conductive mesh (22) on the mentioned layer of insulating substrate (23) prior to the mentioned conductive electrode layer made of transparent oxide or oxides (21).

A preferred embodiment of the present invention has the characteristic of opening grooves in the mentioned layer of insulating substrate (23) for receiving the mentioned conductive mesh (22).

A preferred embodiment of the present invention has the characteristic of depositing directly the mentioned conductive mesh (22) on the surface of the mentioned insulating substrate (23).

A preferred embodiment of the present invention has the characteristic that comprise the mentioned conductive mesh (22) applied using a thin film screen-printer, or by chemical vapor deposition (CVD) or by physical vapor deposition by evaporation (PVD), or using a syringe properly heated.

A preferred embodiment of the present invention has the distinguishing feature of incorporating the mentioned conductive mesh (22) during the manufacturing process of the mentioned insulating substrate (23).

A preferred embodiment of the present invention has the characteristic of heat treating the mentioned conductive mesh (22) and insulating substrate (23), with appropriate temperatures and durations to obtain a sufficiently smooth surface for subsequent deposition of the mentioned conductive electrode made of transparent oxide or oxides (21).

The present invention further describes a method of manufacturing a solar cell which comprises the manufacturing process of substrates and electrode according to the above described.

The present invention further describes a process for the manufacturing of a solar collector system comprising the process of manufacture of solar cells according to the above described.

Current State of Art

Dye-sensitized solar cells (DSCs) may greatly contribute to solve the present energy paradigm since they are able to convert solar energy into electric energy, mimicking the natural process of photosynthesis. This system results from a successful combination of materials: photoelectrode of $TiO_2$ nanoparticles in which organic-metallic dye molecules are adsorbed, electrolyte containing iodide/triiodide redox couple and the platinum counter-electrode. The photoelectric effect discovery by the scientist Edmond Becquerel in 1839 showed the possibility of converting solar energy into electricity, thus attracting the attention of many researchers. Nevertheless, modern photoelectrochemistry became of practical interest only after the first photoelectrochemical studies of semiconductor/electrolyte interface developed by Gerisher.[1]

Although several attempts to use dye-sensitized photoelectrochemical cells in the conversion of solar energy into electricity, these systems showed very low global efficiencies, restraining its entrance in the market. Only after the publication of the work by Brian O'Regan and Michael Grätzel in 1991, DSCs started being considered as a low-cost and promissory alternative to the conventional devices. [2] In the referred work it is described the use of $TiO_2$ nanoparticulated films with high surface area, allowing to obtain global efficiencies higher than 7%.

The working principle of this kind of photoelectrochemical cells and manufacturing process are reported by Michael Grätzel and its co-authors in the following documents U.S. Pat. Nos. 4,927,721 e 5,084,365. [3; 4]

Presently, DSCs show approximately 11% efficiency, a modest value when compared with the 15-18% from silicon cells, but compensated by their better performance in specific operating conditions. On the other hand, DSCs have a significant lower cost than silicon cells.

In DSCs, the semiconductor is a mesoporous oxide layer composed of $TiO_2$ nanometer-sized particles that is sintered to allow electronic conduction. Attached to the surface of the oxide is a monolayer of dye molecules (sensitizer), which upon light absorption are promoted into an excited state. As a result, electrons from the ground state of the dye are injected into the conduction band of the semiconductor, giving rise to formation of excitons (excited electrons) and subsequent charge separation. The free electrons in the conduction band diffuse across the semiconductor toward the external circuit, performing electrical work. Once electrons reach the counter electrode, typically a thin layer of platinum, they react with the electrolyte that fills the space between the two electrodes, usually a solution of an ionic liquid solvent containing a triiodide/iodide redox system. The original state of the oxidized dye is subsequently restored by electron donation from the electrolyte, which is itself regenerated at the platinum counter electrode by reduction of triiodide. The redox electrolyte therefore allows the transport of electrical charge between the two electrodes of the DSC, closing the cycle.

Additionally to the several efforts that have been developed in the field of efficiency and long-term stability of DSCs, the upscalling of the DSC technology to large areas has also been progressed rapidly. However, cell's size and conductivity of substrates influence the internal resistance of solar cells. If the active area of the DSC is larger to produce a larger power output, the overall efficiency decreases because the large surface resistances of the transparent conductive oxide (TCO). For this reason, small size cells are normally used to obtain high conversion efficiencies on non-industrial studies, with an active area smaller than 1 cm2.

To upscale DSCs sizes, three different module designs have been considered: i) parallel grids module; ii) series interconnect Z and W designs module and iii) monolithic series interconnect. Each design shows advantages and disadvantages, proved in past research.

In a parallel connection conductive fingers are incorporated in a large cell to collect current. These conductive fingers have, however, to be protected against the redox electrolyte. The individual cells are connected externally and are then assembled into a solar panel.

The first parallel module design was tested in 1995, using the conductive fingers protected by polymer or ceramic glazes to collect current in a 10×10 cm2 glass substrate module.[5] All the materials selected to reduce the resistive losses of the conducting coating on the glass were corroded by the electrolyte, even when protected, due to pinhole and leakage at the interface overcoated with the substrate. To ensure satisfactory sealing, multilayer thick overcoats were required, increasing the cell thickness and resulting in a fill factor reduction.

Even if it is recognized that the highest active surface area would be obtainable in a parallel grid cell, in 1997 the works on this design were suspended till 2001. At this time, a new design was developed yielding 6% active area efficiency at module level (18×10 cm2), following the identification of new protective coatings for silver grid. The challenge still is to increase the fill factor by reducing the thickness of the cell.

For series interconnected module design, all cells are manufactured simultaneously already with integrated series connection of either Z- or W-type. In the integrated series connection of Z-type the TCO layer coated on the glass substrate is structured by laser scribing. Then, the semiconductor and the counter-electrode layers are screen printed on the respective substrates at the same time than the silver lines and the sealant material.

The sealant material, a glass frit, a polymer or a glass paste, is screen-printed as a protective barrier of the silver lines on both sides.[6] After the sintering process of both semiconductor and counter-electrode, the later is aligned on top of the working electrode and sealed according to the sealant material characteristics. A hermetic seal around the silver lines is obtained and the electrical Z-contact is formed.

High efficiencies are obtained since a scattering layer can be applied on top of the nanostructured semiconductor.

There are no imbalances between the single cells because the photo and the counter-electrodes are placed on different substrates.

On the other hand, in the series connection W-type, the photo and the counter-electrodes are placed on the same substrate in turn, delivering identical output when illuminated from either side. As for Z-connection, the TCO layer on the glass substrate is structured by laser scribing. However, the semiconductor and the counter-electrode material are screen-printed in turn in two substrates, as the sealing material. After the sintering process of both electrodes the two substrates are aligned on top of each other, placing the counter-electrode of one substrate on top of the working electrode of the other substrate. A hermetic seal between the cells is obtained and the electrical W-contact is formed. The main advantage of this arrangement is that no silver lines are required and so it has a simpler fabrication process. However, this series-connection is only cost-effective if its performance is improved since no scattering layer can be applied (because half of the cells are illuminated from the backside). Several studies have been carried out in order to increase the number of photons absorbed by the dye molecules in these arrangements. For instance, the platinum layer and the electrolyte layer should be thinner and the photoelectrode of the back-side illuminated cells should be thicker in order to electronically match with the cells illuminated from the front-side.

The monolithic connection was proposed by Kay et al. in 1996. These authors developed a DSC that allows a series connection on a single glass substrate. Actually, it effectively eliminates one glass substrate (one of the most expensive components of a DSC) by connecting both electrodes to one conductor substrate. The TCO layer coated on the glass substrate is structured by laser scribing. Three screen-printed layers are then applied to the TCO-glass substrate: first the nanoporous photoelectrode; then a porous layer of an electrical insulator to prevent short-circuiting in cases where the material of the counter-electrode would form ohmic contact with the photoelectrodes; finally the porous counter-electrode applied over the bare edge of the TCO and on the adjacent insulator layer, connecting consequently the solar cells in series. At the same time also sealant material is screen-printed. A hermetic seal between cells is again ensured after the sintering process of the layered electrode. This design requires no silver lines and it requires only one TCO glass. Moreover, it allows to adjust the electrode distance varying the thickness of the insulator layer. However, no semitransparent cells are practicable with a monolithic layer sequence due to the use of the mentioned layer. Furthermore, the counter-electrode made of graphite layer may feature high sheet resistance and low catalytic activity. This configuration was suspended in 2000 since it needs improvements in the materials selected, mainly in what concerns the carbon electrode.

Transparent conducting oxides (TCO) are employed as transparent electrodes in flat-panel displays, light-emitting diodes, electrochromic windows and solar cells.[7] In DSCs, the transparent conducting films act both as a window for light to pass and as ohmic contact for carrier transport out of the photovoltaic device. The most used TCO thin films are polycrystalline or amorphous microstructures, which exhibit a resistivity of the order of 10$\Omega$/square and an average transmittance above 80% in the visible range. Therefore, suitable TCO for use as thin-film transparent electrodes should have a carrier concentration of the order of $10^{20}$ cm$^{-3}$ or higher and a bandgap greater than 380 nm to avoid absorption of light over most of the solar spectra. In practice, TCO thin films used in industry are primarily n-type semiconductors, even though suitable p-type transparent conducting oxides are also being researched. Bearing in mind the purpose of obtaining low resistivities, binary compounds thin films are preferred as TCO materials since it is easier to control the chemical composition of their films compared to ternary compounds and multicomponent oxides.

The first TCO was reported in 1907 by Baedeker, who used a primitive vapor deposition system to deposit thin-film CdO that was both optically transparent and electrically conducting.[8] Later, it was recognized that thin films of ZnO, SnO2, In2O3 and their alloys are also TCOs. Doping these oxides resulted in improved electrical conductivity without degrading their optical transmission. Aluminum doped ZnO (AZO), tin doped In2O3, (ITO) and antimony or fluorine doped SnO2 (ATO and FTC)), are among the most utilized TCO thin films in modern technology.[9]

Indium tin oxide (ITO) is one of the most widely used transparent conducting oxides because of its electrical conductivity and optical transparency. However, similarly to other transparent conducting oxides, a compromise between conductivity and transparency has to be reached during film deposition, since higher concentration of charge carriers will increase the material's conductivity, but decrease its transparency. The first thin film of indium tin oxide was deposited by spray chemical vapor deposition (CVD) using a solution of InCl3 and SnCl4, yielding ITO films with relatively low resistivities. Presently, other techniques are used as electron beam evaporation, spray pyrolysis, pulsed laser deposition or a range of sputter deposition techniques. Even if ITO have been in practical use for the majority of transparent electrode applications, alternatives are being fostered because of the cost and scarcity of indium, the principal material of ITO.

Fluorine tin oxide (FTO), a less expensive alternative with lower work function, is being used as TCO in dye-sensitized TiO2 solar cells. Although the conductivity performance is slightly lower than ITO, FTO is less expensive in materials costs and in manufacturing process and avoids problems with indium diffusion into the n-type TiO2 or ZnO nanostructured films during the annealing treatments.

Another alternative being developed are the impurity-doped zinc oxide, as Al- and Ga-doped ZnO (AZO and GZO, respectively). In fact, AZO and GZO thin films are the best candidates since they have low resistivity and they are inexpensive and non-toxic source materials. However, further developments on the deposition techniques are needed, such as magnetron sputtering or vacuum arc plasma evaporation, to enable the preparation of AZO and GZO films on large area substrates with a high deposition rate.

Organic films are being developed using carbon nanotubes networks and graphene, which can be fabricated to be highly transparent. The biggest problem of getting graphene to work as a TCO for organic solar cells is related to the difficulty of getting a good adhesion of the graphene material to the panel. Graphene repels water, so typical procedures for producing an electrode on the surface by depositing the material from a solution are not viable.

Even though researcher's efforts on the development of highly conductive materials, the state-of-the art TCO still limits the efficiency of electron collection in large-area solar cells due to significant ohmic losses. The consequence is an increase on the manufacturing costs of the cells due to the need of using collecting lines, e.g. silver paste, normally applied in a complex way. Moreover, this additional manufacturing step also implies the protection of these silver lines from the electrolyte. This is presently done using a polymer sheet of Surlyn®. This arrangement is complex, expensive and wastes a significant amount of potentially solar illuminated area since collecting lines are normally coated less than 1 cm apart each other.

It was recently described a "cold" sputtering process to deposit a transparent conductive oxide layer over a substrate. During the sputtering process, a plasma is ignited in the processing chamber, naturally heating the substrate; no additional heat is provided to the substrate during this step. After the TCO deposition, the substrate may be annealed and etched to texture the transparent conductive oxide layer.[10]

[1] Gerischer, H. J. Electrochem. Soc. 1966, 113, 1174.
[2] B. O'Regan, and M. Grätzel, A Low-Cost, High-Efficiency Solar-Cell Based on Dye-Sensitized Colloidal TiO2 Films. Nature 353 (1991) 737-740.
[3] M. Grätzel, and P. Liska, Photo-Electrochemical Cell, U.S. Pat. No. 4,927,721, 1990.
[4] M. Grätzel, and P. Liska, Photo-Electrochemical cell and process of making same, U.S. Pat. No. 5,084,365, 1992.
[5] G. E. Tulloch, Light and energy—dye solar cells for the 21st century. Journal of Photochemistry and Photobiology A: Chemistry 164 (2004) 209-219.
[6] A. Mendes, J. Mendes, H. Ribeiro, M. Grätzel, L. Andrade, L. Gonsalves, C. Costa, Glass sealing of dye-sensitized solar cells, PCT/IB2009/055511, 2009.
[7] Klein, A.; Korber, C.; Wachau, A.; Sauberlich, F.; Gassenbauer, Y.; Harvey, S. P.; Proffit, D. E.; Mason, T. O.; Transparent conducting oxides for photovoltaics: manipulation of Fermi level, work function and energy band alignment. Materials 3 (2010) 4892-4914.
[8] Badeker, K.; Ann. Phys. 22 (1907) 749.
[9] Fortunato, E.; Ginley, D.; Hosono, H.; Paine, D. C.; Transparent conducting oxides for photovoltaics. MRS Bulletin 32 (2007) 242-247.
[10] METHOD FOR FORMING TRANSPARENT CONDUCTIVE OXIDE; WO/2010/144357.
[11] Sastrawan, R.; Photovoltaic modules of dye solar cells. PhD Thesis, Freiburg, 2006.

SUMMARY

The main object of the present invention is the description of the manufacturing process of dye-sensitized solar cell modules using glass substrates with high conductive embedded transparent conductive oxide (ETCO) collectors and the correspondent sealing step on an effective way to enhance modules' lifetime.

In the glass substrates here revealed—ETCO glass substrates—is applied a net of very thin conductive lines (2) inserted in groove drawn in the naked glass, which is then coated with a conventional TCO layer (6). This network of highly conductive lines collects the electrons from the TCO layer and drains it to the edges of the module. This technology overcomes the problem concerning the high internal resistances and low fill factor of DSCs within upscalling. The sealing method of these ETCO glass substrates are also described in the present invention. Here, it is used a cost-effective, fast, integrated sealing process for DSCs based on a melting process laser-assisted of low temperature melting glass paste.

The sealing process used in the present invention is performed by the application of a glass string (3 and 4) on the external perimeter of the cell's photoelectrode after the semiconductor printing and sintering. The sintered counter-electrode (11) substrate is placed over the photoelectrode (10) glass substrate and the adhesion process between the sealant material and the sheets of glass starts by applying pressure. The obtained sandwich cell is heated to 100-300° C., temperature below the maximum resistance limit of all components of both electrodes.

Normally a photovoltaic cell module should contain several individual cells connected in series and organized in Z- or W-configurations. In both cases, the individual active areas have to be separated to prevent ionic migration under electrical potential gradients—electrophoresis phenomena. This is very efficiently achieved using the glass string sealing strategy mentioned before.

In order to increase the TCO glass substrate conductivity a new highly conductive surface is disclosed for being used to coat glass sheet substrates in photovoltaic cells and namely in dye sensitized solar cells.

It is disclosed the use of a network of highly conductive metal based lines applied beneath the TCO. In the glass substrate it should be drawn a corresponding network of grooves for receiving the metal based lines. These lines should be applied very precisely on the glass grooves and its surface should be very smooth for receiving the TCO layer without easily cracking. This is obtained by print screening the silver paste or applying a metal or metal alloy with appropriate electrical conductivity and melting point.

The new highly conductive surface was called embedded TCO (ETCO) since it contains an embedded network of highly conductive lines beneath the very thin TCO layer.

The ETCO allows a better usage of the solar energy since it avoids the use of collecting lines coated over the TCO. These lines have to be protected from the electrolyte present in the electrode active areas. The lines and protecting system wastes a significant amount of area in a solar cell module, ca. of 15%. [11] The disclosed invention, with embedded lines in the glass substrate, shows much better performance and allows building up in a much easier way a solar cell module.

FIGURES DESCRIPTION

For easy understanding of the present invention, figures are attached which represent preferred embodiments of the invention which, however, do not intend to limit the scope of this invention.

Figure 2:
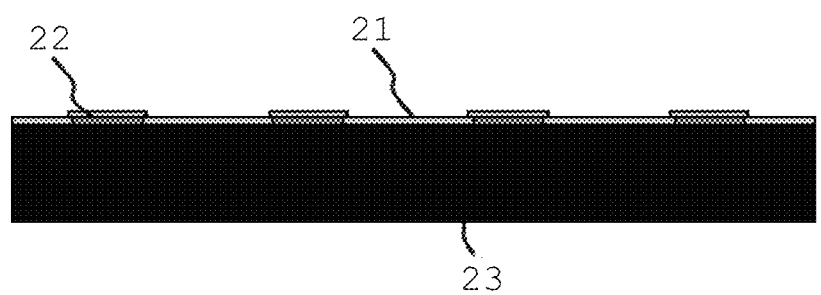

In FIG. 1 is presented, as a non-limitative example, a schematic representation of the glass substrate with the embedded conductive lines. In particular the referred figure shows:
21. TCO layer;
22. Grove filled with an electric conductor such as silver;
23. Glass sheet;

In FIG. 2 is presented, as a non limitative example, a schematic representation of the longitudinal view of a glass substrate accordingly with the present invention. In particular the figure shows:
21. TCO layer;
22. Superficial electrical conductive lines such as silver paste applied without glass scribing.
23. Glass sheet.

Figure 3:
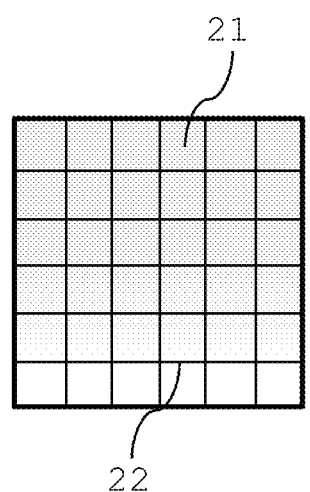

In FIG. 3 is presented, as a non limitative example, a schematic representation of the silver lines network over the naked glass and with posterior TCO deposition. In particular the figure shows:
21. TCO coated surface;
22. Conductive metal line.

Figure 4:
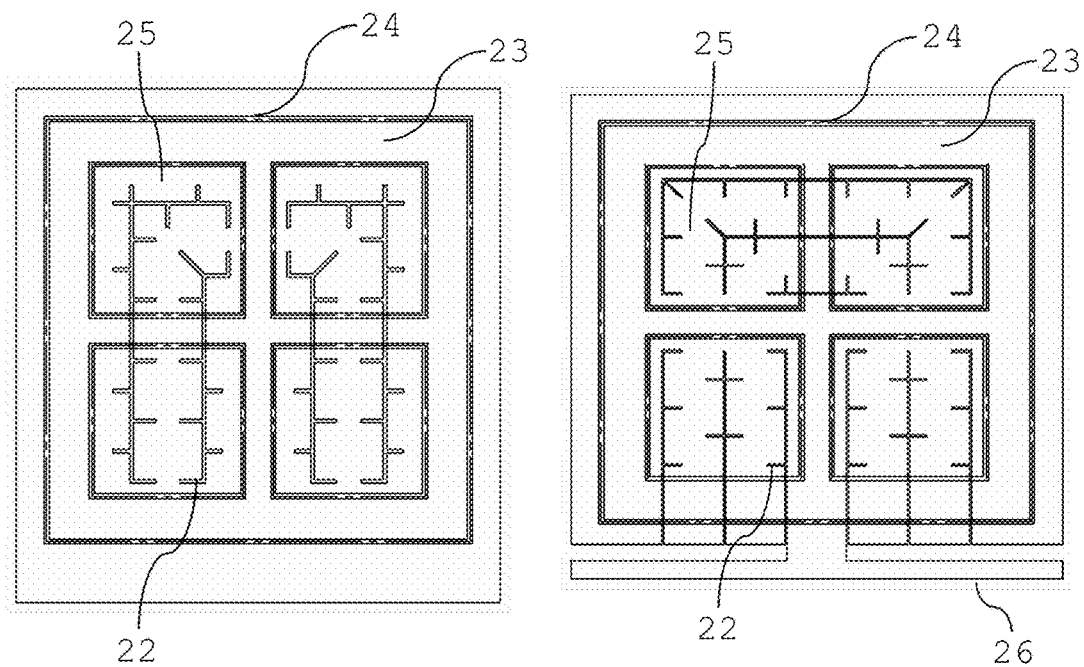

In FIG. 4 is presented, as a non limitative example, a schematic representation of a W-configuration module whose substrates have a metallic mask applied in the glass substrates (23), with posterior TCO coating. In particular the figure shows for both sides of the cell's module:

22. Superficial electrical conductive lines such as silver paste applied without glass scribing.
23. Glass sheet.
24. Glass sealing.
25. Individual sealing;
26. External contacts.

Figure 5:
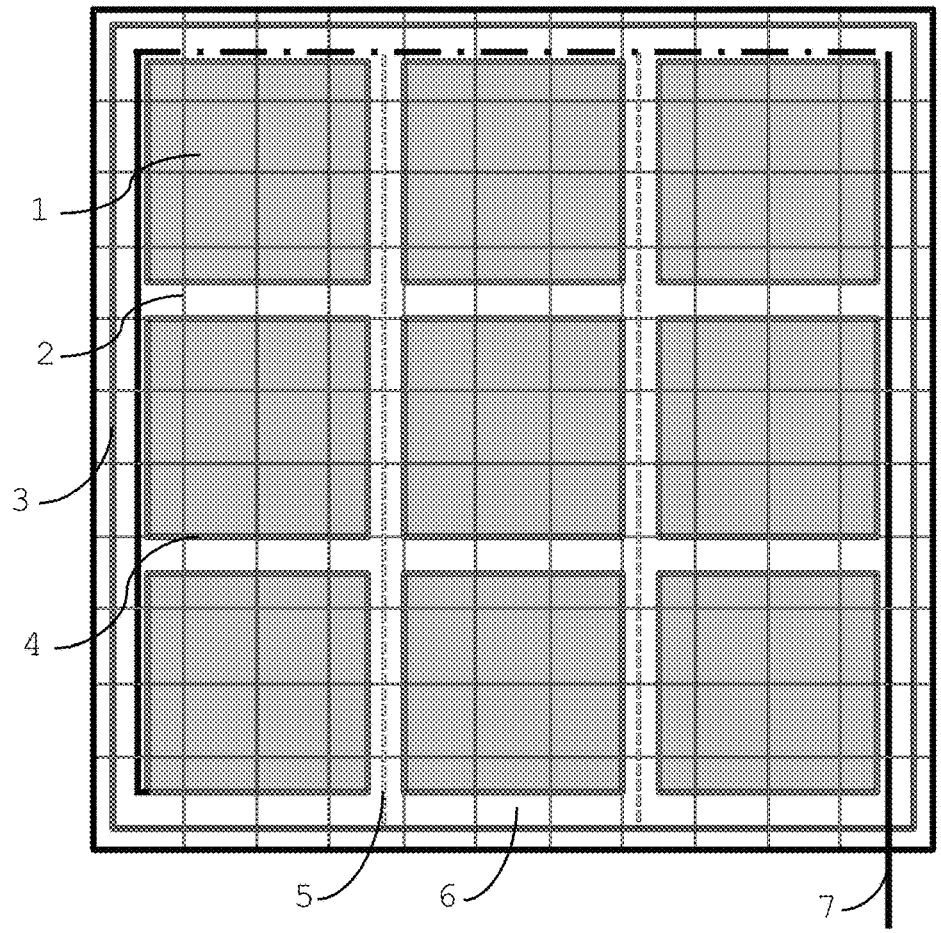

In FIG. 5 is presented, as a non limitative example, a schematic representation of the DSC module based on laser assisted sealing process and technology. In particular the referred figure shows:

1. Individual cell composed by the elements sketched in FIG. 2;
2. Conductive material grid chosen to substrate embedded electrical collector;
3. Sealing cord of the module;
4. Sealing cord of each individual cell;
5. Laser scribing of the silver lines from the substrate embedded collector;
6. Glass substrate of the DSC module based on embedded collectors technology;
7. Silver collector that collects current from the substrate embedded collector.

Figure 6:
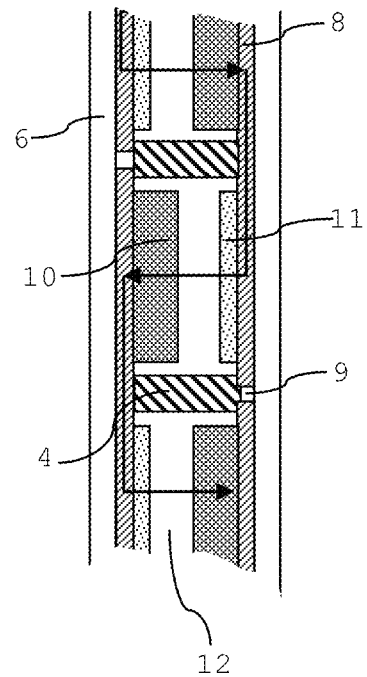

In FIG. 6 is presented, as a non limitative example, a longitudinal cut of the DSC module assembled in a W-configuration. The arrows represent the electron flow thrown the module. In particular the referred figure shows:

4. Sealing cord of each individual cell;
6. Glass substrate of the DSC module based on embedded collector's technology;
8. Transparent conductive oxide (TCO);
9. TCO laser scribing;
10. Photoelectrode (semiconductor with a sensitizer adsorbed on its surface;
11. Counter-electrode;
12. Space between electrodes filled with electrolyte.

Figure 7:
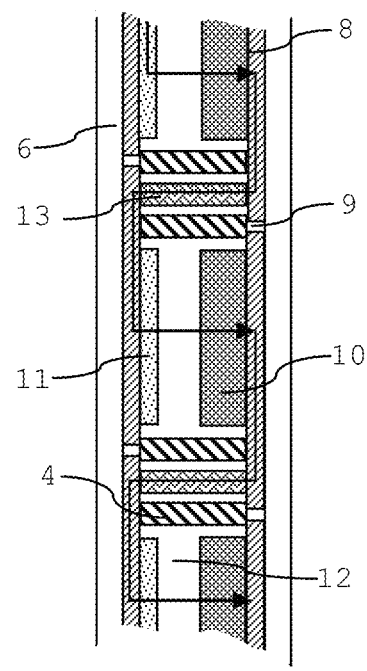

In FIG. 7 is presented, as a non-limitative example, a longitudinal cut of the DSC module assembled in a Z-configuration. The arrows represent the electron flow thrown the module. In particular the referred figure shows:

4. Sealing cord of each individual cell;
6. Glass substrate of the DSC module based on embedded collector's technology;
8. Transparent conductive oxide (TCO);
9. TCO laser scribing;
10. Photoelectrode (semiconductor with a sensitizer adsorbed on its surface;
11. Counter-electrode;
12. Space between electrodes filled with electrolyte.
13. Silver collector.

Figure 8:
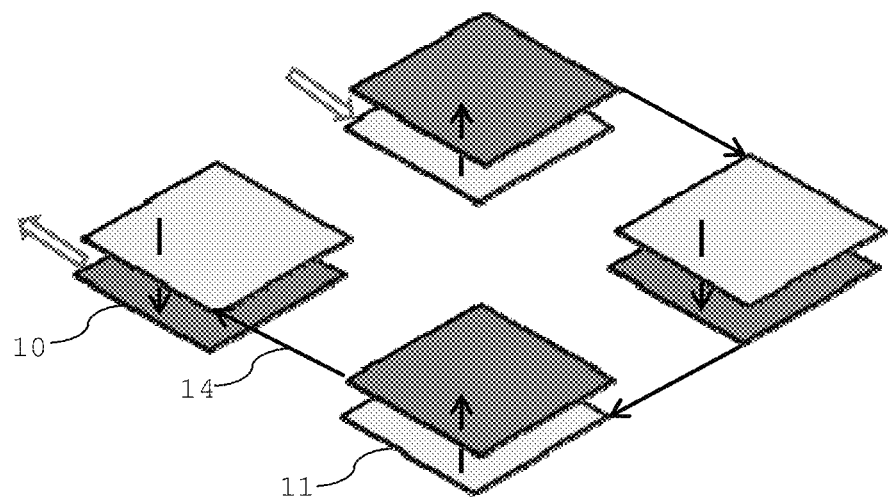

FIG. 8 presents, as a non-limitative example, a sketch of the electron flow in a DSC module assembled in a W-configuration. The arrows represent the electron flow thrown the module. In particular the referred figure shows:

10. Photoelectrode (semiconductor with a sensitizer adsorbed on its surface;
11. Counter-electrode;
14. Electron flow.

Figure 9:
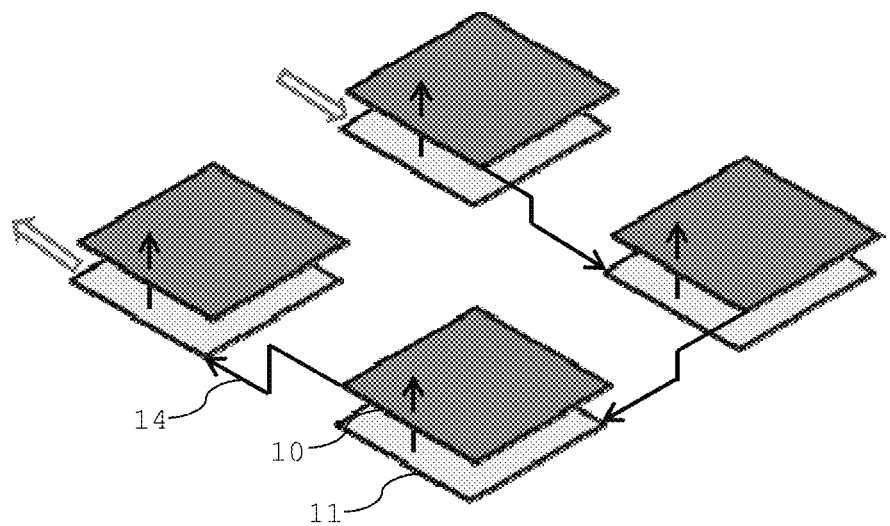

FIG. 9 presents, as a non-limitative example, a sketch of the electron flow in a DSC module assembled in a Z-configuration. The arrows represent the electron flow thrown the module. In particular the referred figure shows:

10. Photoelectrode (semiconductor with a sensitizer adsorbed on its surface;
11. Counter-electrode;
14. Electron flow.

DETAILED DESCRIPTION

In photovoltaic solar cells such as dye-sensitized solar cells or DSC, the electricity generated is collected using a very thin transparent coating over the glass sheet, named transparent coating oxide (TCO). This thin coating drives the generated electricity to the exterior of the cell. However, the TCO has a high electrical resistivity, in the range of 10Ω/square and electrical collector lines of highly conductive materials have to be applied to the TCO surface.

In the case of DSCs, these electrical collecting lines, made namely of a silver paste, should be protected from the active area of the cell. This is presently normally done using a polymer sheet of Surlyn®. This arrangement is complex, expensive and wastes a significant amount of potentially solar illuminated area since collecting lines are normally coated less than 1 cm apart each other.

The present invention discloses a new strategy for obtaining a transparent highly conductive surface applied to a glass substrate or other non-conductive substrate. A net of very thin conductive lines, preferably a grid, should be inserted in grooves drawn in the naked glass substrate, which should be coated afterwards with a conventional TCO layer The grooved conductive lines drive very efficiently the electronic flow produced above the TCO surface and with a minimal power loss. Since the network of conductive lines is engraved beneath the TCO it is no more necessary to protect it from the electrolyte of the active areas of the cell module.

In the naked glass substrate, it should be drawn the required network of grooves using, for example, a laser technique known as scribing. These grooves should then be filled with a highly conductive material. This can be done by screen-printing a suitable silver paste or by applying a low melting metal cord or a metal alloy cord, such as zinc (melting point of 420° C.) or aluminum-zinc-silicon alloy (approximate melting point of 533° C.) silver-zinc, with a melting point above the maximum temperature used for sintering the electrodes and below the maximum glass substrate allowable temperature.

It is important to guaranty that no residues of the applied metal are present over the glass sheet other than the grooves. It is also important that these conductive lines exhibit a very smooth surface for receiving the TCO coating. The TCO is a very thin coating, in the range of 200 nm to 300 nm, or 300-400 nm, or 400-500 nm, or 500-600 nm, or 600-700 nm and even from 100 nm to 1000 nm of e.g. indium tin oxide (ITO) or of aluminum-doped zinc oxide (AZO).

Moreover, it must have a good adhesion to the substrate since it has to receive the photoelectrode and the counter-electrode of the cell without cracking. For obtaining this smooth surface, the metal-based lines should receive a heat treatment. The silver paste lines should be very accurately coated over the grooves and then thermally treated accordingly to the manufacturer's specifications.

The metal lines of metal alloy lines should also be very accurately coated inside the grooves and heat-treated up to the metal or metal alloy melting point. This heating treatment produces very smooth surfaces that allow TCO good adhesion.

The conductive lines can be very thin, preferably c.a. 100 μm, which can reach is some cases up to 2 mm, allowing this way an effective utilization of the solar energy. Two successively placed and consecutive lines should distanced from each other 5 to 10 mm, depending on the quantity of electrical energy to be harvested and on the TCO sheet's resistivity.

The conductive lines should be applied preferably in grid. The depth of the grooves should be suitable to the production process and to the conductive material that will be placed inside them, but preferably between 50 and 500 µm.

It also allows building up solar cells in a much easier way.

The inclusion of the metal network in the glass substrate can also be done during the manufacturing process of the glass. Thus, a liquid metal is introduced in the melted glass and is then submitted to the typical cooling steps that standard glass is. By doing so, the two previous steps concerning the scribing of the naked glass and the drawing of the metal lines are no longer needed. This seems to be a more integrated manufacturing process for industrial purposes.

The conductive lines can also be applied over the glass substrate by an alternative process, significantly simpler—FIG. 2. The electrical collective lines' net or grid can be directly printed over the glass substrate using a screen printer to print a suitable conductive silver paste. Other methods can be used to apply the conductive lines, such as CVD (chemical vapor phase deposition) or sputtering. The TCO layer is then applied over the conductive lines.

In a DSC, the photo electrode and the counter electrode should be distanced, preferably, between 20 µm to 40 µm. This way, and because the conductive lines should not cause short-circuit between the electrodes, these should not have preferably more than 10 µm of thickness and should have more preferably less than 1 µm of thickness, in the case of the inexistence of grooves. The width of the conductive lines should be chosen accordingly to the electrical current that they will transport, in a scale ranging from 100 µm to 1000 µm.

Again, the conductive lines should be preferably applied in a net or grid where its lines should distance from each other preferably from 5 mm to 10 mm.

Also preferably, the conductive lines can distance from each other up to 1 cm.

A preferred embodiment of the present invention describes the use of a grid of silver conductive lines embedded in the naked glass surface and then coated with a thin TCO layer.

First, the glass grooves are drawn using laser scribing technique with exact width and depth of ca. 200 µm. In these grooves a silver paste was applied by the screen printing technique. After thermal treatment the conductive lines had an homogeneous and leveled surface with the edges of the glass surface at the interface with the grooves.

These silver lines were spaced 1 cm from each other vertical and horizontally over a 2 mm thick glass sheet 7 cm×7 cm—FIG. 3.

Then, the glass substrates are washed with deionised water and detergents, after which they are stacked and sonicated in ethanol for 30 minutes and dried under air convection. After drying, the glass substrate was coated with an ITO layer of 200 nm (15Ω/square) by sputtering. The resulted substrate/TCO showed a constant electrical resistance, independent over the distance that is measured, for distances superior of the distance between conductive lines.

A preferred embodiment of the present invention describes the use of a zinc wire with a very accurate diameter of 500 µm was applied on the glass grooves and allowed to melt. The glass grooves were produced using a scribing laser and have a cross section with exactly the same area of the zinc wire. The scribing lines were drawn 1 cm from each other over a 2 mm thick sodium glass sheet 7 cm×7 cm. The resulting glass with embedded metal lines was then cleaned with deionised water and detergents, after which they are stacked and sonicated in ethanol for 30 minutes and dried under air convection. After drying, the glass substrate was coated with an ITO layer of 200 nm (15Ω/square) by sputtering. The resulted substrate/TCO showed a constant electrical resistance, independent over the distance that is measured, for distances superior of the distance between conductive lines.

A preferred embodiment of the present invention describes the use of a grid of silver lines that is screen printed in glass substrate. The lines, with 2 µm of thickness and 100 µm of width were printed 5 mm apart from each other. After the thermal treatment of the silver lines, the glass sheets were cleaned with deionised water and detergents, after which they are stacked and sonicated in ethanol for 30 minutes and dried under air convection. After drying, the glass substrate was coated with an ITO layer of 200 nm (15Ω/square) by sputtering. The resulted substrate/TCO showed a constant electrical resistance, independent over the distance that is measured, for distances superior of the distance between conductive lines.

The present invention is trivially adapted to other pohotoelectrochemical cells than DSC, as water splitting photoelectrochemical cells for hydrogen production or a combination of DSC and photoelectrochemical cells for water splitting.

The referred grid can be also replaced by other mesh type structure that properly interconnect the affected areas, namely hexagonal or fractal meshes, or simply parallel or branched conductive lines.

The referred mesh can also be applied with a "comb" shape (FIG. 4), or interdigitial structures, whose extensions or "fungers" can be aligned or misaligned with each other, which may or may not interpenetrate.

The present invention discloses a complete manufacturing process for DSC modules composed by an optimized number of individual cells (1). Each individual cell may be isolated from the neighboring cells by using a proper sealant (4), mechanically and thermally stable and chemically inert against the redox mediator. Furthermore, the sealing material must prevent mass transport between neighboring cells. In the present invention it is used a cost-effective, fast, integrated sealing process for DSCs based on a fusing process laser-assisted of low temperature fusing glass paste. The description of this sealing method is going to be described below. The modules may be assembled on Z- or W-configuration. The glass substrate of the module is coated with a net of very thin conductive lines (2) inserted in grooves drawn in the naked glass, being then protected with a conventional TCO layer.

This new substrate has a grid/mesh of highly conductive lines embedded or applied in the glass substrate under the TCO layer. The TCO is a very thin layer, usually with c.a. 200 nm to 400 nm, or c.a. 400 to 500 nm, or c.a. 500 to 600 nm, or c.a. 600 to 700 nm, or even of 100 nm to 1000 nm.

Depending on the module configuration used, the module assembling should include the following steps:
i) Preparation of the ETCO glass substrates and hole drilling at the rear side of the modules for electrolyte filling;
ii) washing of the ETCO glass substrates with deionised water and detergents, after which they are stacked and sonicated in ethanol for 30 minutes and dried under air convection;
iii) screen-printing of photoelectrode and counter-electrode in the respective ETCO glass substrate;
iv) sintering process of the photoelectrode and counter-electrode;

v) screen-printing of the glass cord of the module and from the individual cells;

vi) laser-assisted sealing of the module and individual cells;

vii) coloration step of the photoelectrode by injecting a dye solution through one hole in the counter-electrode, and collecting the dye solution from the second hole for reprocessing;

viii) recirculation with pure solvent (acetonitrile or ethanol) to remove unadsorbed dye molecules, and dried preferably under nitrogen;

ix) introduction of electrolyte through the rear-side holes of the module;

x) sealing of the holes with glass power fused by laser.

Each individual cell (1) constituting the module described in the present invention consists of a first electrode (10) composed by a mesoporous transparent oxide semiconductor layer of nanometer-sized particles deposited on an ETCO-glass substrate (6 and 8). Attached to the surface of the semiconductor oxide is a monolayer of dye molecules (sensitizer). Photo excitation of the sensitizer results in the injection of an electron into the conduction band of the oxide.

The second electrode (11), also deposited in the glass substrate preferably including the referred metallic grid (6 and 8), is coated with a catalyst material able to overcome the high activation energy of the electron transfer in the counter-electrode. The space between the two electrodes (12) is filled with an electrolyte, commonly a redox couple in an organic solvent. The two electrodes are sealed by employing a string of a glass paste precursor (9).

The glass precursor string is then heated to its melting point assisted by the use of a laser beam, allowing the two substrates of the cell to be sealed.[6]

The glass substrates are usually coated with a transparent conducting oxide (8) (e.g. $SnO_2$:F or $SnI_2$:In with high optical transmission (>80%) and low ohmic resistance (<10Ω/square). However, for cells with larger areas, as needed for the upscalling of DSC technology, this is reflected in larger surface resistances of the TCO, increasing the internal resistances and lowering the fill factor.

In the present invention a new glass substrate is used, that has an embedded metallic grid and a conventional TCO layer.[7] In this substrate it is applied a net of very thin conductive lines (2) (e.g. Ag, Au, Cu, Al, Ni, Sn or a mixture) inserted in grooves drawn in the naked glass, which is then coated with a conventional TCO layer (6). This network of highly conductive lines collects the electrons from the TCO layer and drains it to the edges of the module.

The semiconductor layer constituting the photoelectrode (10) is typically obtained applying a paste of metal oxide nanocrystalline particles over a conducting substrate by screen-printing or doctor-blading. The nanocrystalline oxide films should have high surface area of, with particles with an average size of about 20 nm, leading to a quite significant surface area available for dye adsorption, responsible for the absorption of a high percentage of the incident sunlight. Titanium dioxide is the preferred semiconductor in DSCs (anatase form).

Nevertheless, alternative wide band gap oxides such as ZnO, $Nb_2O_5$ or $SnO_2$ can also be considered. Modified nanocrystalline $TiO_2$ structures can be employed: nanotubes, nanowires, nanorods and inverse opals. These ordered and oriented structures enhance the electrical conductivity in $TiO_2$ photoelectrodes, increasing electron percolation through the film. In addition, highly ordered nanostructures seem to induce stronger internal light-scattering effects, resulting in higher light harvesting efficiencies.

A second layer can be sintered on top of the transparent layer acting as a light-scattering layer. It consists of larger titania particles (between 100 and 400 nm) that works as a phototrapping system. The sensitizers adsorbed on the semiconductor surface are based on bipyridyl complexes of ruthenium; organic dyes, such as porphyrins, phtalocyanines, cyanines and merocyanines, hemicyanine, anthocyanine, indoline, coumarin, eosin Y, perylene, anthraquinone, polyene, pentacene, triphenylamine; semiconductor quantum dots; co-sensitization, i.e., the use of several dyes with different spectral responses simultaneously.

The cells are colored by injecting the dye solution through a hole in the counter-electrode and collecting the dye solution from a second hole for reprocessing, after the sealing process of the cell has taken place. Then the photoelectrodes are flushed with pure solvent (acetonitrile or ethanol) to remove unadsorbed dye molecules, and dried with nitrogen flow.

The photoexcited electron travels through the external circuit and is then transferred to the electrolyte (12) where it reduces the oxidant species in the counter-electrode (11) in the presence of a catalyst able to ensure fast reaction kinetics.

Platinum is traditionally used as the most efficient catalyst not only because it provides high exchange current densities, but also because it is transparent. Carbon-based (e.g. carbon, carbon black, graphite, activated carbon, graphene, single-wall carbon nanotubes or conductive polymers) can also be used as counter electrodes in DSCs. The counter-electrode can be applied also by screen-printing.

The redox couple in the electrolyte (12) allows the regeneration of the dye after electron injection into the conduction band of the semiconductor, as well as to transport the positive charges (holes) toward the counter electrode.

The most used liquid electrolyte in DSCs is based on the charge mediator triiodide/iodide redox couple in non-volatile solvents as ionic liquids or in low-viscosity volatile solvents as acetonitrile. The electrolyte is introduced in the inner-part of the cells after the sealing step using the same two pre-drilled holes used to inject the dye.

The sealing process used in the present invention considers the application of a glass paste string (3 and 4) on the external perimeter of the cell's photoelectrode after the semiconductor printing and sintering. The solvents of glass paste string are allowed partially to evaporate and then the sintered counter-electrode (11) substrate is placed over the photoelectrode (10) glass substrate. The adhesion between the sealant paste and the sheets of substrates starts by applying pressure. The obtained sandwich cell is heated to 100-300° C., temperature below the maximum resistance limit of all components of both electrodes. This heating step is performed as described by the paste manufacturers to allow the solvents of the glass paste to evaporate; at this stage the cell is not yet sealed. This DSC manufacturing process optimization avoids a long heating step suggested in patent WO/2007/067402. The photoelectrode (10) and the counter-electrode (11) are assembled in such a way that allows the two electrodes to be spaced by a predefined constant distance along the entire active area of the cell (12). This precise distance is normally achieved using a spacer such as a metal frame. In order to perform the soldering process with permanent adhesion of the sealant glass precursor to the glass sheets of the two electrodes it is necessary that, after the contact between the two sheets, the temperature raises till the soldering temperature.

However, the cell's inner components cannot be heated at temperatures greater to 300° C. This temperature raise is achieved by using a laser that perpendicularly focuses over the counter-electrode.

When going through the counter-electrode (11), the beam focuses at the glass precursor string causing its fusion and avoiding the over-heating of all the rest of the cell. The laser beam runs all the string screen-printed at the edges of the cell/module, in a quick forward-backward pathway. The forward step is always longer than the backward one. This allows a more effective sealing since the heat is distributed over a larger region.

The metallic lines of the current collectors drawn in the naked glass may need a special sealing procedure, depending on the material used. For the case of silver paste, it may be needed to focus the laser beam from the same substrate the silver line is engraved on, namely the photoelectrode.

The sealant glass precursor (3 and 4) should have a low melting point, with a thermal expansion coefficient similar to that of the substrates within the relevant temperature range and contain no lead. Example of such glass paste is G018-255 from SCHOTT. After soldering the electrodes, the cell should cool down and, after that, the dye and the electrolyte can be introduced by the small holes in the counter-electrode.

These holes need to be closed after the entire addition of the cell's components. This is done using low melting glass, at melting temperature, applied over the holes. For improving the adhesion between sealant and glass, the hole should be heated locally using a laser beam. The melting glass can be applied using a syringe like system.

Usually a photovoltaic cell module should contain several individual cells connected in series to produce an overall voltage of 12 V or 24 V. These individual cells can be assembled in different ways such as Z- and W-configurations. In both cases, the individual active areas have to be separated to prevent ionic migration.

This is achieved very efficiently using the glass string sealing strategy described before. In the case of Z-configuration, the electronic flow should be transferred from the photoelectrode of one active area to the counter-electrode of an adjacent active area. This is done drawing two parallel glass string lines filled with an electric conductor such as silver paste, low melting metal, namely tin or zinc, or low melting alloys such as of zinc-silver.

As will be easily understood from the expert in the field, any reference to the above glass sealing process is interchangeable between module sealing, cell or cell and module.

Example 1

This example shows the manufacturing process of a dye-sensitized solar cell module in a W-configuration. After the preparation and cleaning of the substrates with embedded metal grid lines, the TCO layer on the glass substrate is structured by laser scribing. The semiconductor and the counter-electrode material are screen-printed in turn in the two substrates, as the sealing material. After the sintering process of both electrodes the two substrates are aligned on top of each other, placing the counter-electrode of one substrate on top of the working electrode of the other substrate. A hermetic seal between the cells is obtained and the electrical W-contact is formed—FIG. 3.

Example 2

This example shows the manufacturing process of a dye-sensitized solar cell module in a Z-configuration. After the preparation and cleaning of the substrates preferably with embedded metal grid lines the TCO layer coated on the glass substrate is structured by laser scribing. Then, the semiconductor and the counter-electrode layers are screen printed on the respective substrates at the same time than the silver lines and the sealant material. The sealant material is screen-printed as a protective barrier of the silver lines on both sides. After the sintering process of both semiconductor and counter-electrode, the latter is aligned on top of the working electrode and sealed according to the sealant material characteristics. A hermetic seal around the silver lines is obtained and the electrical Z-contact is formed—FIG. 4.

The above described embodiments may be combined. The following claims further define preferred realizations/embodiments of the present invention.

The invention claimed is:

1. A manufacturing process of a dye-sensitized solar cell comprising the steps of:
    (a) preparing first and second solar cell electrode substrates for a photo-electrode and a counter-electrode, respectively, each solar cell electrode substrate of the solar cell electrode substrates being a glass substrate;
    (b) depositing on the first solar cell electrode substrate materials to form the photo-electrode, and depositing on the second solar cell electrode substrate materials to form the counter-electrode;
    (c) depositing a glass welding material on an external perimeter of the photo-electrode, in order to be able to join the substrates and, at the same time, to isolate the solar cell;
    (d) bringing the glass substrate of the photo-electrode and the glass substrate of the counter-electrode closer to each other and aligning the substrates;
    (e) laser welding the two substrates, one with the other, using the glass welding material previously applied in (c), the laser welding including focusing a laser beam on the glass welding material (i) along a first direction in a laser beam path during a forward step and (ii) along a direction opposite the first direction in the laser beam path during a backward step, the forward step being longer than the backward step.

2. The process according to claim 1 further comprising forming grooves in at least one of the glass substrates, which is an insulating substrate, to receive conductive lines.

3. The process according to claim 2 further comprising depositing the conductive lines directly on a surface of the insulating substrate.

4. The process according to claim 2, wherein the conductive lines are applied through a screen printer, or by chemical vapor deposition (CVD), or by physical vapor deposition (PVD), or using a syringe.

5. The process according to claim 2, wherein the conductive lines are included in a manufacture process of the insulating substrate.

6. The process according to claim 2, wherein the conductive lines and the insulating substrate have undergone heat treatment such as to result in a surface acceptable for subsequent deposition of one or more transparent conductive oxides.

7. The process according to claim 2, in which a material of the conductive lines is a metal selected from: Ag, Au, Cu, Al, Ni, Sn, Zn, or composite materials based on these metals, or mixtures of two or more of these metals (metal alloys).

8. The process according to claim 7, wherein the material of the conductive lines is a metal selected from: Ag, Al, Sn, Zn, or composite materials based on these metals, or mixtures of two or more of these metals (metal alloys).

9. The process according to claim 2, wherein the conductive lines are formed as plural rows and plural columns of conductive mesh on or in a surface of the insulating substrate, and the plural rows of the conductive mesh are separated from each other by a separation of from 5-10 mm, and the plural columns are separated from each other by a separation of from 5-10 mm.

10. The process according to claim 1, wherein the laser welding in (e) enables dispersing heat throughout a given length of the glass welding material to progressively heat and cool the glass welding material to obtain a stable glass welding material.

11. The process according to claim 1, wherein the laser has a maximum power, in a range from 5 W to 60 W, at wavelengths between 1000 nm and 1200 nm.

12. The process according to claim 1, further comprising:
    forming one or more holes in at least one of the solar cell electrode substrates, to permit subsequent introduction of electrolyte;
    introducing the electrolyte via said one or more previously formed holes; and
    sealing said one or more previously formed holes.

13. The process according to claim 12, wherein the sealing is performed using a laser and glass welding material, the sealing further including:
    applying a coating of the glass welding material in a vicinity of said one or more previously formed holes; and
    melting the glass welding material via the laser at a temperature below 500° C.

14. The process according to claim 1, further comprising:
    heating the solar cell electrode substrates, prior to the laser welding in (e).

15. The process according to claim 14, wherein the heating is performed at a temperature between 100° C. and 300° C.

16. A device which is obtained via the process according to claim 1.

* * * * *